United States Patent
Cho

(10) Patent No.: US 9,633,711 B2
(45) Date of Patent: Apr. 25, 2017

(54) METHOD OF MANAGING DATA OF STORAGE DEVICES RESPONSIVE TO TEMPERATURE

(71) Applicant: Samsung Electronics Co., Ltd., Suwon-si, Gyeonggi-do (KR)

(72) Inventor: Sung-bum Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/135,869

(22) Filed: Apr. 22, 2016

(65) Prior Publication Data

US 2016/0365138 A1    Dec. 15, 2016

(30) Foreign Application Priority Data

Jun. 15, 2015  (KR) .................... 10-2015-0084328

(51) Int. Cl.
| | | |
|---|---|---|
| *G11C 7/00* | (2006.01) | |
| *G11C 11/00* | (2006.01) | |
| *G11C 11/406* | (2006.01) | |
| *G11C 7/10* | (2006.01) | |
| *G06F 13/16* | (2006.01) | |

(52) U.S. Cl.
CPC .... *G11C 11/40626* (2013.01); *G06F 13/1636* (2013.01); *G06F 13/1673* (2013.01); *G11C 7/1072* (2013.01); *G11C 7/1018* (2013.01)

(58) Field of Classification Search
CPC ......... G11C 11/40611; G11C 11/40626; G11C 7/00; G11C 11/406; G11C 11/40603; G11C 2211/4062; G11C 11/40615; G11C 7/1072

See application file for complete search history.

(56) References Cited

U.S. PATENT DOCUMENTS

| | | | |
|---|---|---|---|
| 5,430,680 A | 7/1995 | Parris | |
| 6,795,362 B2 | 9/2004 | Nakai et al. | |
| 7,149,140 B2 | 12/2006 | Hur et al. | |
| 7,272,063 B1 * | 9/2007 | Egerer | G11C 7/04 365/211 |
| 7,355,919 B2 | 4/2008 | Riho et al. | |
| 7,610,165 B2 * | 10/2009 | Jeong | G11C 7/04 327/513 |
| 8,015,389 B2 | 9/2011 | Sato et al. | |
| 8,077,537 B2 | 12/2011 | Kawakubo et al. | |
| 8,238,185 B2 * | 8/2012 | Lee | G11C 5/143 365/189.09 |

(Continued)

FOREIGN PATENT DOCUMENTS

KR    1020010004655 A    1/2001

OTHER PUBLICATIONS

Jedec Standard "Low Power Double Data Rate 3 (LPDDR3)", JESD209-3B (Revision of JESD209-3A, Aug. 2013), Jedec Solid State Technology Association, Aug. 2013, 146 pages.

*Primary Examiner* — Hien Nguyen
(74) *Attorney, Agent, or Firm* — Myers Bigel, P.A.

(57) ABSTRACT

Methods of managing data of a storage device responsive to temperature can include measuring a temperature of the storage device, changing a duration of a refresh interval of the buffer memory responsive to the measured temperatures, changing a number of refresh bursts during the refresh interval responsive to the measured temperature, and refreshing data of the buffer memory based on the refresh interval and the number of the refresh bursts that are changed responsive to temperature.

15 Claims, 15 Drawing Sheets

(56) References Cited

U.S. PATENT DOCUMENTS

| | | | |
|---|---|---|---|
| 8,520,450 B2* | 8/2013 | Kim | G11C 11/406 |
| | | | 365/189.07 |
| 8,572,333 B2* | 10/2013 | Confalonieri | G11C 13/0004 |
| | | | 711/103 |
| 8,619,485 B2 | 12/2013 | Klein | |
| 8,635,511 B2 | 1/2014 | Takeuchi et al. | |
| 9,390,784 B2* | 7/2016 | Cho | G11C 7/04 |
| 2005/0201174 A1* | 9/2005 | Klein | G11C 11/40611 |
| | | | 365/222 |
| 2013/0007357 A1 | 1/2013 | Isaac et al. | |
| 2013/0080680 A1* | 3/2013 | Chu | G06F 12/0246 |
| | | | 711/102 |
| 2014/0003161 A1 | 1/2014 | Son et al. | |
| 2014/0112087 A1 | 4/2014 | Klein | |
| 2014/0325122 A1* | 10/2014 | Kim | G11C 16/00 |
| | | | 711/103 |
| 2015/0003172 A1 | 1/2015 | Kim et al. | |

\* cited by examiner

METHOD OF MANAGING DATA OF STORAGE DEVICES RESPONSIVE TO TEMPERATURE

CROSS-REFERENCE TO RELATED APPLICATION

This application claims priority under 35 USC §119 to Korean Patent Application No. 10-2015-0084328, filed on Jun. 15, 2015, in the Korean Intellectual Property Office, the entire contents of which are incorporated herein by reference.

BACKGROUND

The inventive concepts relate to semiconductor devices, and more particularly, to storage devices for managing data responsive to temperature and methods of managing data thereof.

Storage devices such as solid-state drives (SSD) are used for storing data of various types such as text, graphics, or software code. The SSD can include a buffer memory in order to temporarily store data corresponding to a request for data input/output provided from a host. When a volatile memory device such as dynamic random access memory (DRAM) is used as the buffer memory, the SSD performs DRAM refresh operation so as to sense and rewrite data by taking into account the data-volatile characteristic of the DRAM. The DRAM refresh operation may reduce an SSD performance.

SUMMARY

The inventive concepts provide methods of managing data for controlling a refresh operation of a buffer memory in a storage device responsive to temperature in order to minimize a deterioration of the performance of the storage device.

The inventive concepts also provide devices for managing data responsive to temperature.

According to aspects of the inventive concepts, a method of managing data of a storage device can include a buffer memory including measuring a temperature of the storage device, changing a duration of a refresh interval of the buffer memory responsive to the measured temperatures, changing a number of refresh bursts during the refresh interval responsive to the measured temperature, and refreshing data of the buffer memory based on the refresh interval and the number of the refresh bursts that are changed responsive to temperature.

According to other aspects of the inventive concepts, a storage device can include a data storage unit, and a controller configured to control the data storage unit. The controller can include a buffer memory configured to temporarily store data transmitted to and/or from the data storage unit, and a buffer memory controller configured to change a duration of a refresh interval and the number of refresh bursts during the refresh interval responsive to temperature in order to hold data stored in the buffer memory.

According to other aspects of the inventive concepts, a memory controller can include a buffer memory control interface configured to control a refresh operation of a buffer memory and a temperature interface configured to receive a temperature measurement. The memory controller may be configured to control the refresh operations of the buffer memory via the buffer memory control interface responsive to the temperature measurement received via the temperature interface.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
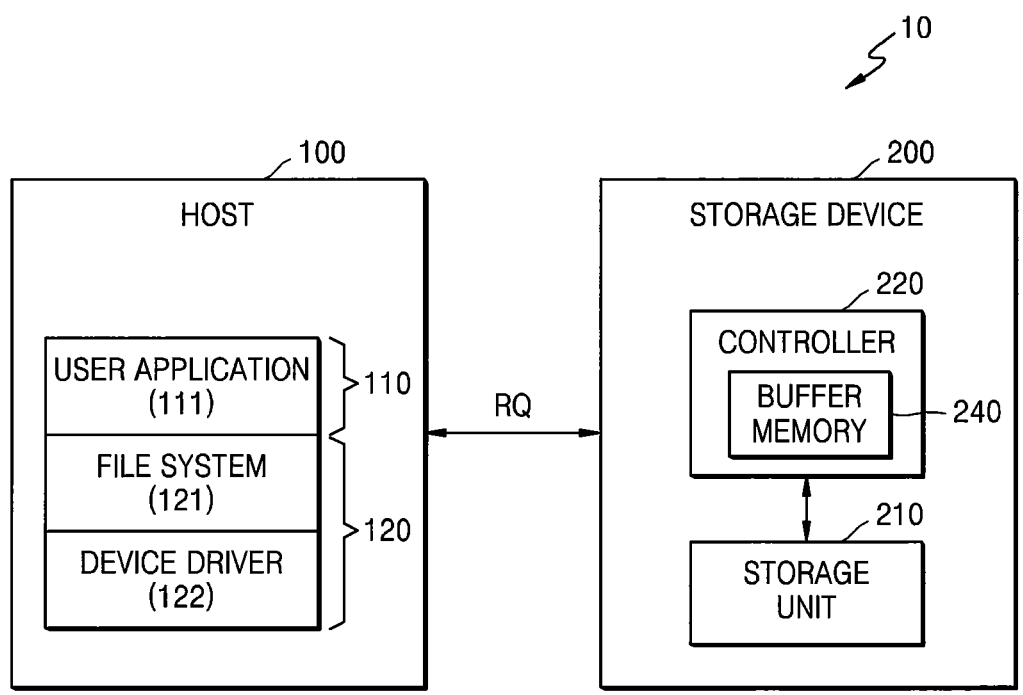
FIG. 1 is a view of an electronic device including a storage device for managing data responsive to temperature, according to example embodiments of the inventive concepts.

The present inventive concepts will now be described more fully hereinafter with reference to the accompanying drawings in which example embodiments of the inventive concepts are shown. These embodiments are provided so that this disclosure is thorough and complete and fully conveys the scope of the inventive concepts to one skilled in the art. Accordingly, while the inventive concepts can be modified in various ways and take on various alternative forms, specific embodiments thereof are shown in the drawings and described in detail below as examples. There is no intent to limit the inventive concepts to the particular forms disclosed. On the contrary, the inventive concepts are to cover all modifications, equivalents, and alternatives falling within the spirit and scope of the appended claims and accompanying disclosure. Like reference numerals refer to like elements throughout. In the drawings, the thicknesses of layers and regions may be exaggerated for clarity.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concepts are not limited to the described order of the operations. For example, two consecutively described processes may be performed substantially at the same time or performed in an order opposite to the described order.

Expressions such as "at least one of" when preceding a list of elements, modify the entire list of elements and do not modify the individual elements of the list.

FIG. 1 is a view of an electronic device including a storage device for managing data responsive to temperature, according to example embodiments of the inventive concepts.

Referring to FIG. 1, an electronic device 10 may include a host 100 and a storage device 200. The host 100 may include a user device such as, for example, a personal/portable computer, a tablet PC, a personal digital assistant (PDA), a portable media player (PMP), a digital camera, or a camcorder, though the inventive concepts are not limited thereto. The host 100 may store or read data to/from the storage device 200 through an input/output request RQ.

The host 100 may be connected to the storage device 200 through various interfaces such as, for example, a universal serial bus (USB) interface, a multi-media card (MMC) interface, a peripheral component interconnect (PCI) interface, a PCI-express (PCI-E) interface, an advanced technology attachment (ATA) interface, a serial-ATA interface, a parallel-ATA interface, a small computer systems interface (SCSI), an enhanced small device interface (ESDI) or integrated drive electronics (IDE) interface, though the inventive concepts are not limited thereto.

The storage device 200 may perform a write and/or read operation in response to the input/output request RQ of the host 100. The storage device 200 may include, for example, a solid-state drive (SSD). According to example embodiments, the storage device 200 may be a PC card (for example, a personal computer memory card international association (PCMCIA) card), a CompactFlash card (CF), a SmartMedia card (SM or SMC), a memory stick, a multi media card (for example, MMC, eMMC, RS-MMC, or MMC-micro), a Secure Digital (SD) card (for example, SD, miniSD, microSD, or SDHC), a universal flash storage (UFS), or a data server, though the inventive concepts are not limited thereto.

The storage device 200 may include a data storage unit 210 and a controller 220 controlling a general operation of the data storage unit 210.

The data storage unit 210 may store data during the write operation and may read the stored data during the read operation. The data storage unit 210 may include, for example, a non-volatile memory such as a flash memory.

According to an exemplary embodiment, the data storage unit 210 may include NAND flash memory, vertical NAND flash memory (for example, V-NAND), NOR flash memory, resistive random access memory (RRAM), phase-change memory (PRAM), magnetoresistive random access memory (MRAM), ferroelectric random access memory (FRAM), or spin transfer torque random access memory (STT-RAM), though the inventive concepts are not limited thereto.

The host 100 may include a user space 110 and a kernel space 120. The user space 110 is a region in which a user application 111 may be executed, and the kernel space 120 is a restrictively reserved region for kernel execution. The kernel may be a privileged portion of an operating system running on the host. The kernel space 120 may include a file system 121, a device driver 122, and so on. The file system 121 may manage at least one file generated by the user application 111 or the operating system. The device driver 122 may interface devices such as the storage device 200 with the user application 111. The file system 121 and the device driver 122 may be stored as software.

The user application 111 may request the file system 121 of the host 100 to write a file and/or read a file to/from the storage device 200. The file system 121 may store a file in the storage device 200 in response to the request from the user application 111 and/or may read the file from the storage device 200.

File data and metadata may be stored in the data storage unit 210 when the file system 121 stores a file in the storage device 200. The file data may include contents of the file, and the metadata may include a file attribute and a location of a block of the storage device 200 in which the file data is stored.

When the file system 121 reads a file from the storage device 200, the stored metadata may be read from the data storage unit 210 and the file data may read based on the read metadata.

The storage device 200 may include a buffer memory 240 in the controller 220 in order to increase the write/read speed when storing and/or reading a file to/from the data storage unit 210. The file data, the metadata, and address mapping information may be stored in the buffer memory 240. The buffer memory 240 may include a volatile memory device such as dynamic random access memory (DRAM) and/or static random access memory (SRAM) having a high read/write speed. For example, the buffer memory 240 including DRAM may require a refresh operation to stably store the stored data. According to example embodiments of the inventive concepts, the buffer memory 240 may be disposed outside the controller 220.

The controller 220 may maintain the data by the refresh operation of the buffer memory 240. The controller 220 may change refresh intervals responsive to temperature and may refresh the buffer memory 240 by a method of changing the number of refresh bursts during every refresh interval.

Figure 2:
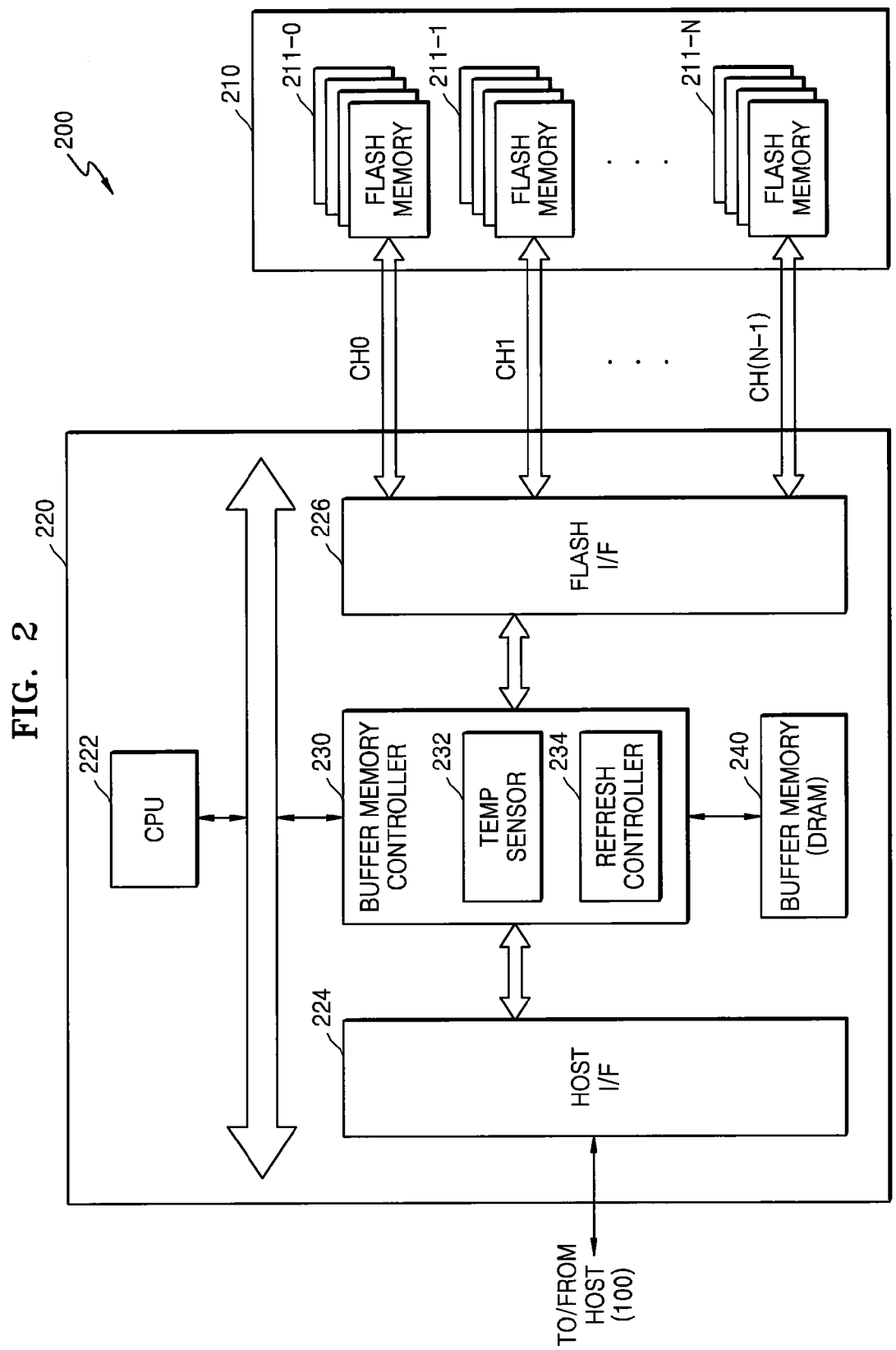
FIG. 2 is a view of a storage device for managing data responsive to temperature according to example embodiments of the inventive concepts.

FIG. 2 is a view of a storage device for managing data responsive to temperature according to example embodiments of the inventive concepts.

Referring to FIG. 2, the storage device 200 may include a data storage unit 210 and a controller 220. The data storage unit 210 may include a non-volatile memory such as a flash memory. The controller 220 may include a central processing unit 222 (hereinafter, abbreviated as CPU), a host interface 224, a flash interface 226, a buffer memory controller 230, and a buffer memory 240. In some embodiments, the buffer memory 240 may be disposed outside the controller 220 instead of in the controller 220.

At least one channel, for example, N channels, may be formed between the data storage unit 210 and the controller 220. A plurality of flash memories 211-1 to 211-N may be electrically connected to each of the channels CH0 to CH(N−1). The flash memories 211-1 to 211-N may be respectively connected to their corresponding channels among the channels CH0 to CH(N−1). For example, the flash memories 211-1 may connected to a corresponding channel, the channel CH0, among the channels CH0 to CH(N−1). The channels CH0 to CH(N−1) may represent independent buses for transmitting commands and/or data to corresponding flash memories 211-1 to 211-N. In some embodiments, sets of the flash memories 211-1 to 211-N may share one channel.

According to example embodiments, memories of the same kind may be connected to one of the channels CH0 to CH(N−1) and memories of different kind or the same kind may be connected to other channels.

In order to rewrite data in the flash memories 211-1 to 211-N, a data erase operation may be performed in advance before reprogramming the flash memories 211-1 to 211-N with the new data. A unit of data written in the flash memories 211-1 to 211-N may be different from a unit of the erased data unit. The write operation may be performed by page units and the erase operation may be performed by block units, in the flash memories 211-1 to 211-N. A block may include a plurality of pages. That is, the unit of the data written in the flash memories 211-1 to 211-N may be smaller than the unit of the erased data unit.

A flash translation layer (FTL) may be used between the file system 121 (of FIG. 1) of the host 100 and the flash memories 211-1 to 211-N, in part, to hide the erase operation in the flash memories 211-1 to 211-N. The FTL may map a logical block address (LBA) generated by the file system 121 during the write operation in the flash memories 211-1 to 211-N with a physical block address (PBA) of the flash memories 211-1 to 211-N, such as a PBA of the flash memories 211-1 to 211-N in which the data erase operation may have already been performed. Due to the address mapping function of the FTL, the host 100 may recognize the storage device 200 including the flash memories 211-1 to 211-N as a hard disk drive (HDD) and may access the flash memories 211-1 to 211-N by the same method as the hard disk drive.

The CPU 222 of the controller 220 may control an operation of the storage device 200. The storage device 200 may exchange commands, address, and/or data with the host 100 (of FIG. 1) through the host interface 224 by the control of the CPU 222. The storage device 200 may exchange data with the flash memories 211-1 to 211-N through the flash interface 226 by the control of the CPU 222. The flash interface 226 may be formed to selectively perform software and hardware interleave operations through the channels CH0 to CH(N−1).

The buffer memory controller 230 may control an access operation such as a read/write operation and/or a refresh operation of the buffer memory 240 in response to the control of the CPU 222. The buffer memory controller 230 may control the refresh operation of the buffer memory 240 by a method of changing refresh intervals and the number of refresh bursts during every refresh interval.

The buffer memory 240 may temporarily store file data and metadata transmitted between the flash memories 211-1 to 211-N and the host 100. The buffer memory 240 may store software required for performing the address mapping function of the FTL and/or programs to be performed by the CPU 222. Furthermore, address mapping information processed by the FTL may be stored in the buffer memory 240. The buffer memory 240 may include a volatile memory such as SRAM and/or DRAM having a high read/write speed.

Data input from the host 100 via the host interface 224 may be temporarily stored in the buffer memory 240 through the buffer memory controller 230 by the control of the CPU 222. The data stored in the buffer memory 240 may be provided to the flash memories 211-1 to 211-N through the buffer memory controller 230 and the flash interface 226 by the control of the CPU 222.

In some embodiments, data input from the flash memories 211-1 to 211-N via the flash interface 226 may be temporarily stored in the buffer memory 240 through the buffer memory controller 230 by the control of the CPU 222. The data stored in the buffer memory 240 may be provided to the host 100 through the buffer memory controller 230 and the host interface 224 by the control of the CPU 222.

Figure 3:
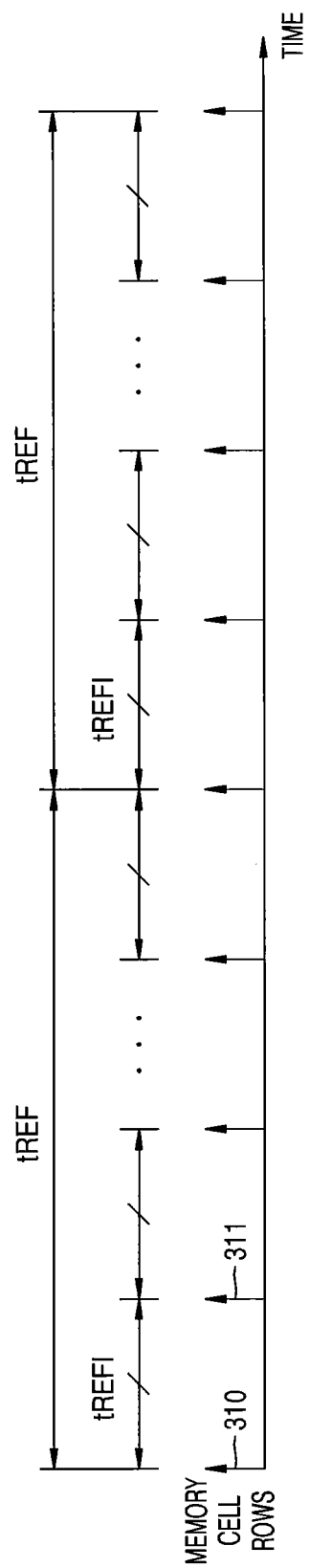
FIG. 3 is a view of a general refresh operation of dynamic random access memory (DRAM)

FIG. 3 is a view of a general refresh operation of DRAM. When the buffer memory 240 includes DRAM, the DRAM may perform a refresh operation so as to sense and rewrite data before losing a charge of a memory cell by a leakage current. As illustrated in FIG. 3, the DRAM typically performs a refresh operation so that memory cell rows 310 in which memory cells are connected may be refreshed during a refresh period tREF. The refresh period tREF is a period defined by, for example, DRAM standards, and may be, for example, 64 ms or 32 ms, though the inventive concepts are not limited thereto. An interval between a refresh operation corresponding to a memory cell row 310 and a refresh operation corresponding to next memory cell row 311 is defined as a refresh interval tREFI. In some embodiments, the refresh interval tREFI may be determined as the duration of the refresh cycle divided by the number of memory cell rows to be refreshed. For convenience of explanation, the refresh interval is represented as a first refresh interval tREFI during the refresh period tREF.

The first refresh interval tREFI may be a refresh interval during an auto refresh operation performed by a command from the buffer memory controller 230 in an access mode of the DRAM.

The refresh operation performed during every first refresh interval tREFI during the refresh period tREF may lower the performance of the storage device 200. The refresh operation of the DRAM is an operation of precharge-refresh-active corresponding to memory cells connected to memory cell rows. The precharge operation can include a closing operation of a memory bank previously opened, the refresh operation can include refresh operations of the memory cells connected to the memory cell rows, and the active operation can include a re-opening operation of the memory bank in which the refresh operation is performed.

It may be a burden on the performance of the storage device 200 to perform the precharge operation and the active operation during every first refresh interval tREFI in the buffer memory 240 including the DRAM. The buffer memory controller 230 may control the refresh operation by using an open page policy from among DRAM operating characteristics. The open page policy may perform a refresh operation corresponding to the opened memory bank and may not perform a precharge operation before the refresh operation. Therefore, the buffer memory controller 230 may control a burst refresh operation to be performed in order to reduce the number of precharge and active operations from the refresh operation of the buffer memory 240. A burst refresh operation may be a refresh operation in which a series of refresh operations are performed concurrently over a group of memory cell rows of the buffer memory 240.

In the buffer memory 240, a charge stored in a cell capacitor may be reduced or eliminated over time even while there is no read/write operation due to the leakage current of the DRAM. The leakage current of the DRAM may have a temperature dependency and thus may decrease at a low temperature and may increase at a high temperature. Therefore, the refresh operation may be changed to set the refresh period to be shorter in duration when the buffer memory 240 is at a high temperature and set to be longer in duration when the buffer memory 240 is at a low temperature. The buffer memory controller 230 may control the refresh intervals of the buffer memory 240 to be changed responsive to temperature.

The buffer memory controller 230 may include a temperature sensor 232 measuring the temperature of the storage device 200 and the refresh controller 234. The refresh controller 234 may control the refresh operation of the buffer memory 240 according to the temperature measured by the temperature sensor 232. The refresh controller 234 may change the refresh intervals and the number of the refresh bursts responsive to the measured temperatures and may control the buffer memory 240 to be refreshed according to the changed refresh intervals and the number of the refresh bursts.

The refresh operation of the buffer memory 240 controlled by the buffer memory controller 230 will be described in detail with reference to FIGS. 4 to 12. According to example embodiments, a refresh method of the buffer memory 240 described with reference to FIGS. 4 to 12 may be realized as software or firmware in the buffer memory controller 230.

Figure 4:
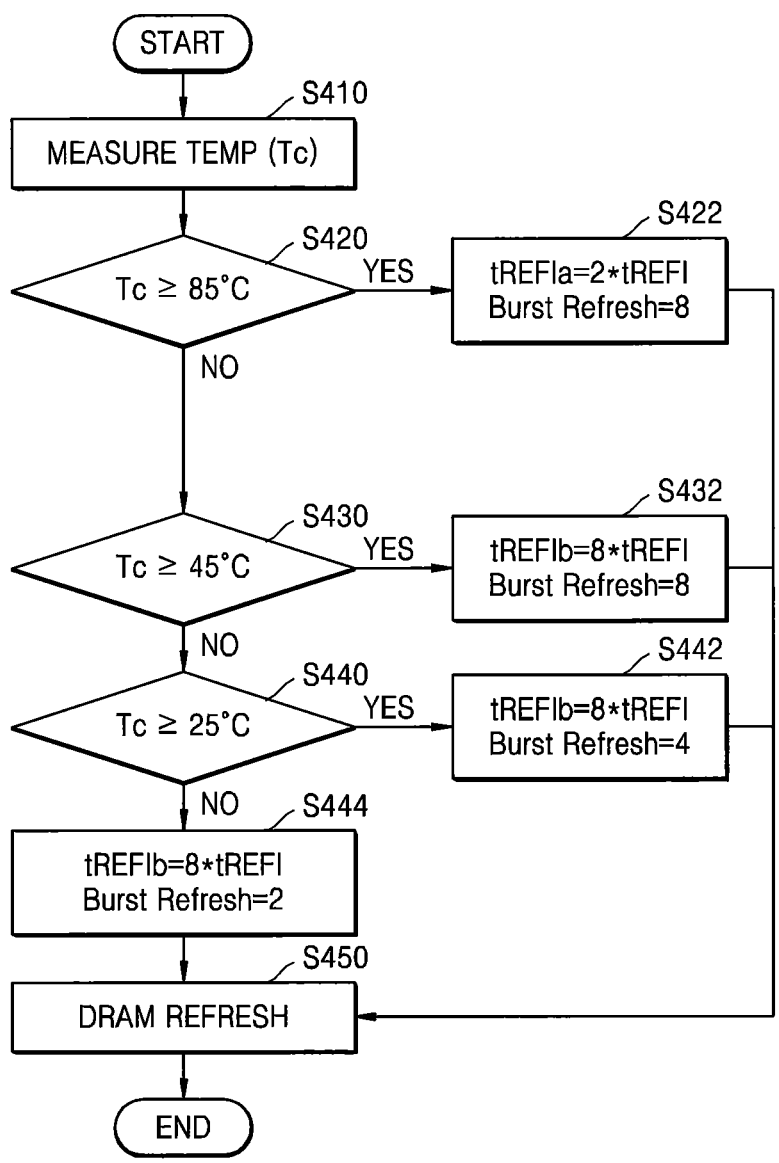
FIGS. 4 to 6 illustrate an embodiment of methods for managing data of a storage device responsive to temperature according to example embodiments of the inventive concepts.
Figure 5:
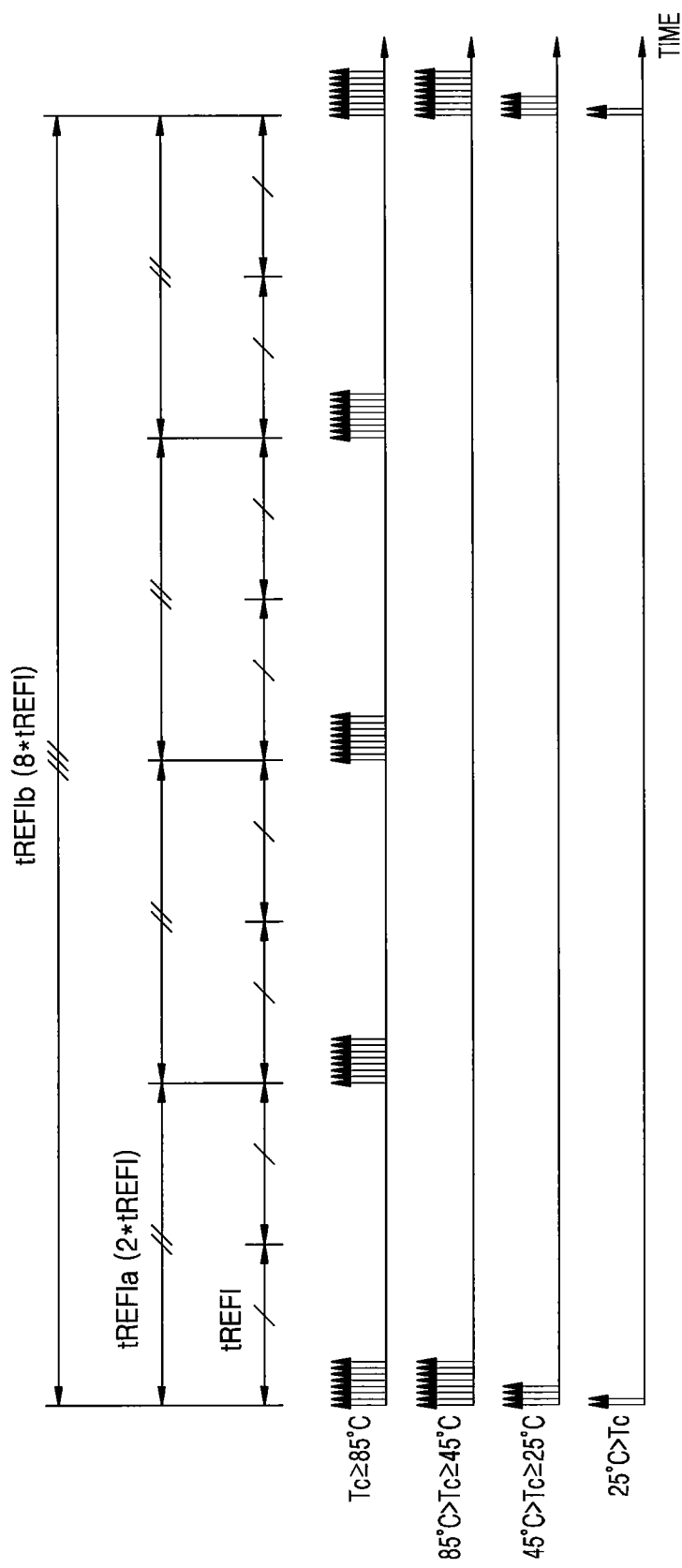
Figure 6:
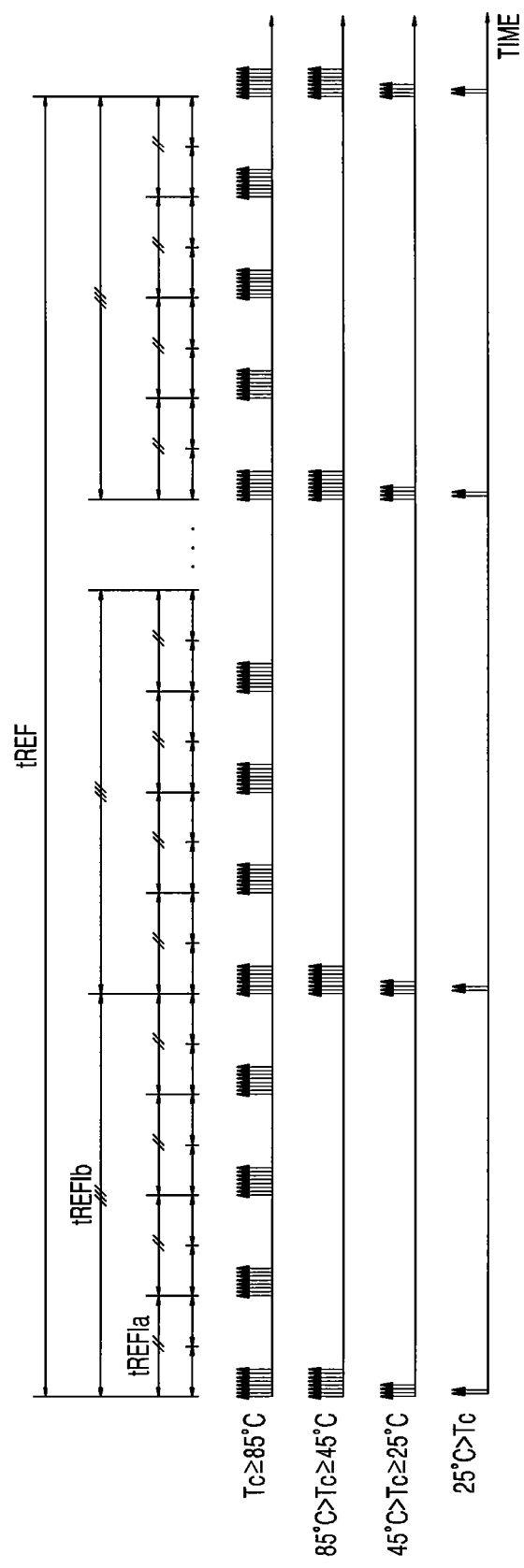

FIGS. 4 to 6 illustrate an embodiment of methods for managing data of a storage device 200 responsive to temperature according to example embodiments of the inventive concepts. FIG. 4 is a flowchart illustrating a refresh method of a buffer memory 240 in the storage device 200, and FIGS. 5 and 6 are timing charts according to the refresh method of FIG. 4.

Referring to FIG. 4 in relation with the storage device 200 of FIG. 2, the temperature sensor 232 of the buffer memory controller 230 may measure temperature Tc of the storage device 200 (S410).

When the measured temperature Tc is 85° C. or more (S420), the refresh controller 234 may set the buffer memory 240 to be refreshed at a second refresh interval tREFIa, longer than the first refresh interval tREFI, and/or may set memory cell rows of a first group during every second refresh interval tREFIa to be refreshed by bursts (S422). The second refresh interval tREFIa may be set as, for example, a refresh interval corresponding to twice the first refresh interval tREFI, though the inventive concepts are not limited thereto. For example, the burst refreshed memory cell rows of the first group may be formed of eight memory cell rows. According to a refresh condition set in the refresh controller 234, the memory cell rows of the first group formed of eight memory cell rows during every second refresh interval tREFIa corresponding to twice the first refresh interval tREFI may be refreshed by bursts in the buffer memory 240 (S450).

When the measured temperature Tc is 45° C. or more, and lower than 85° C. (S430), the refresh controller 234 may set the buffer memory 240 to be refreshed at a third refresh interval tREFIb, longer than the first refresh interval tREFI, and/or may set memory cell rows of a first group during every third refresh interval tREFIb to be refreshed by bursts (S432). For example, the third refresh interval tREFIb may be set as a refresh interval corresponding to eight times the first refresh interval tREFI, though the inventive concepts are not limited thereto. In some embodiments, the burst refreshed memory cell rows of the first group may be formed of eight memory cell rows. According to the refresh condition set in the refresh controller 234, the memory cell rows of the first group formed of eight memory cell rows during every third refresh interval tREFIb may be refreshed by bursts in the buffer memory 240 (S450).

When the measured temperature Tc is 25° C. or more and lower than 45° C. (S440), the refresh controller 234 may set the buffer memory 240 to be refreshed at the third refresh interval tREFIb, longer than the first refresh interval tREFI, and/or may set memory cell rows of a second group during every third refresh interval tREFIb to be refreshed by bursts (S442). For example, the burst refreshed memory cell rows of the second group may be formed of four memory cell rows. According to the refresh condition set in the refresh controller 234, the memory cell rows of the second group formed of four memory cell rows during every third refresh interval tREFIb corresponding to eight times the first refresh interval tREFI are refreshed by bursts in the buffer memory 240 (S450).

When the measured temperature Tc is lower than 25° C. (S440), the refresh controller 234 may set the buffer memory 240 to be refreshed at the third refresh interval tREFIb, longer than the first refresh interval tREFI, and/or may set memory cell rows of the third group during every third refresh interval tREFIb to be refreshed by bursts (S444). For example, the burst refreshed memory cell rows of the third group may be formed of two memory cell rows. According to the refresh condition set in the refresh controller 234, the memory cell rows of the third group formed of two memory cell rows during every third refresh interval tREFIb corresponding to eight times the first refresh interval tREFI may be refreshed by bursts in the buffer memory 240 (S450).

As illustrated in FIG. 5 with reference to the refresh method of the buffer memory 240 of FIG. 4, when the temperature Tc of the storage device 200 is 85° C. or more, the memory cell rows of the first group formed of eight memory cell rows during each of the second refresh interval tREFIa corresponding to twice the first refresh interval tREFI may be refreshed by bursts in the buffer memory 240. When the temperature Tc of the storage device 200 is 45° C. or more and lower than 85° C., the memory cell rows of the first group formed of eight memory cell rows during every third refresh interval tREFIb corresponding to eight times the first refresh interval tREFI may be refreshed by bursts.

When the temperature Tc of the storage device 200 is 25° C. or more and lower than 45° C., the memory cell rows of the second group formed of four memory cell rows during every third refresh interval tREFIb corresponding to eight times the first refresh interval tREFI may be refreshed by bursts. When the temperature Tc of the storage device 200 is lower than 25° C., the memory cell rows of the third group formed of two memory cell rows during every third refresh interval tREFIb corresponding to eight times the first refresh interval tREFI may be refreshed by bursts.

As illustrated in FIG. 6 based on refresh timing method of the buffer memory 240 according to temperature of FIG. 5, a refresh operation of the buffer memory 240 may be performed during a refresh period tREF according to a pre-defined standard. In FIG. 6, the number of the refresh operations during the refresh period tREF may be reduced since refresh intervals increase as the temperature Tc decreases. It may be possible to reduce the number of precharge and active operations associated with the refresh operation, since the number of refresh bursts during every refresh interval may be changed according to the temperature Tc. Therefore, it may be possible to reduce a burden on the performance of the storage device 200 (of FIG. 2) by performing the refresh operation of the buffer memory 240 so that the number of refresh bursts may be changed during every refresh interval corresponding to a measured temperature.

Figure 7:
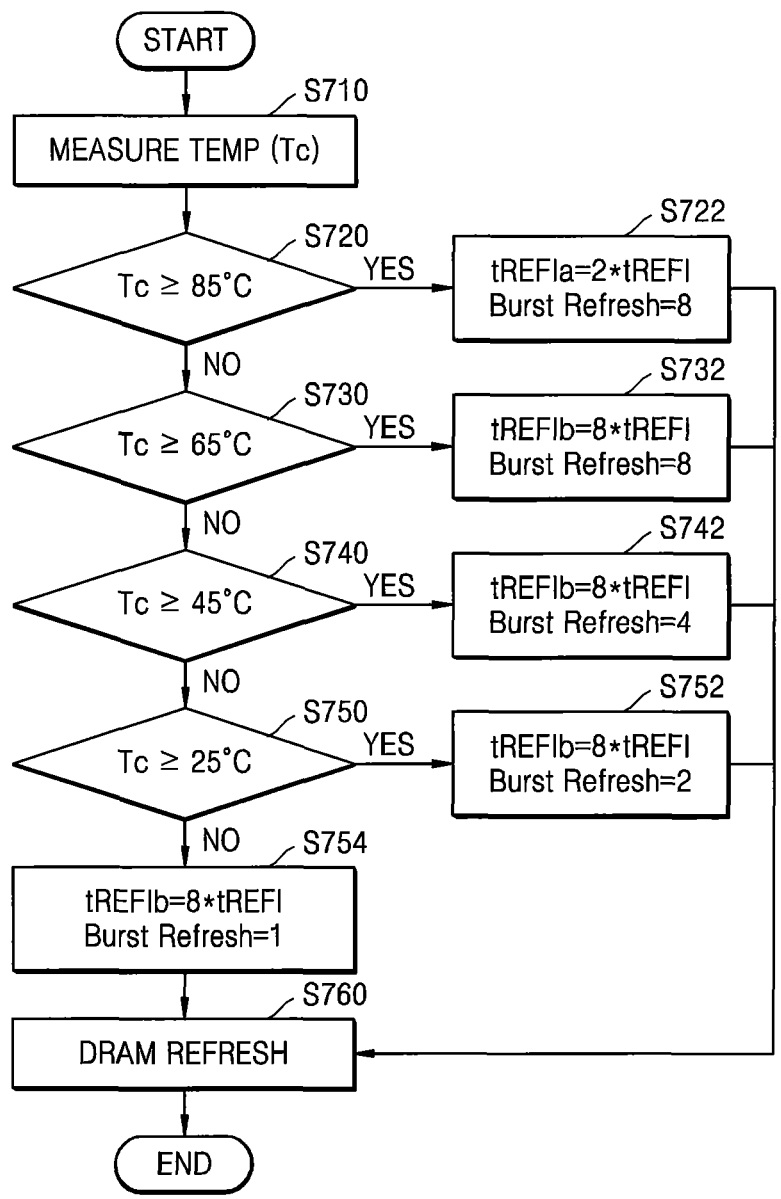
FIGS. 7 to 9 illustrate another embodiment of methods for managing data of a storage device responsive to temperature according to example embodiments of the inventive concepts.
Figure 8:
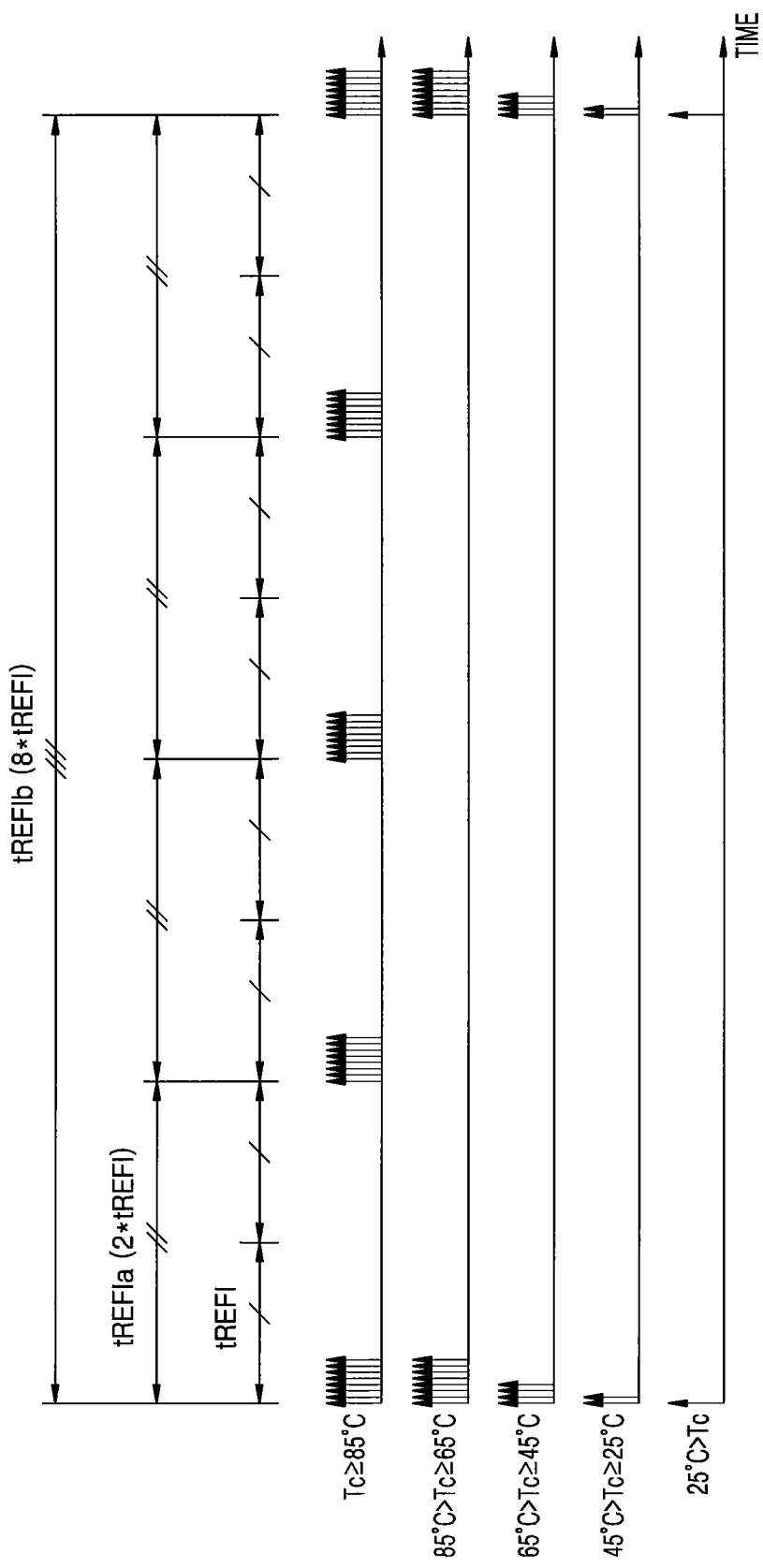
Figure 9:
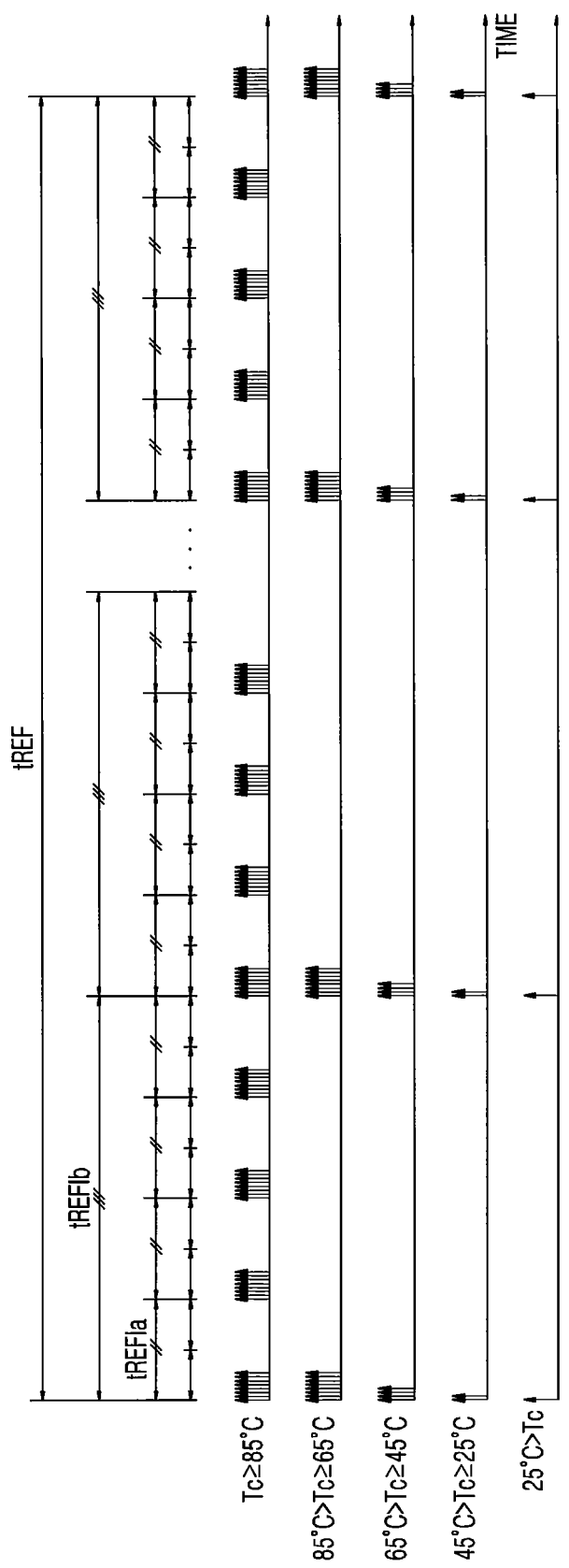

FIGS. 7 to 9 illustrate another embodiment of methods for managing data of a storage device 200 responsive to temperature according to example embodiments of the inventive concepts. FIG. 7 is a flowchart illustrating a refresh method of a buffer memory 240 in the storage device 200, and FIGS. 8 and 9 are timing charts according to the refresh method of FIG. 7.

Referring to FIG. 7 in relation with the storage device 200 of FIG. 2, the temperature sensor 232 of the buffer memory controller 230 may measure temperature Tc of the storage device 200 (S710).

When the measured temperature Tc is 85° C. or more (S720), the refresh controller 234 may set the buffer memory 240 to be refreshed at a second refresh interval tREFIa corresponding to twice the first refresh interval tREFI and/or may set memory cell rows of a first group formed of eight memory cell rows during every second refresh interval tREFIa to be refreshed by bursts (S722). According to a refresh condition set in the refresh controller 234, the memory cell rows of the first group formed of eight memory cell rows during every second refresh interval tREFIa corresponding to twice the first refresh interval tREFI may be refreshed by bursts in the buffer memory 240 (S760).

When the measured temperature Tc is 65° C. or more and lower than 85° C. (S730), the refresh controller 234 may set the buffer memory 240 to be refreshed at a third refresh interval tREFIb corresponding to eight times the first refresh interval tREFI and/or may set memory cell rows of the first group formed of eight memory cell rows during every third refresh interval tREFIb to be refreshed by bursts (S732). According to the refresh condition set in the refresh controller 234, the memory cell rows of the first group formed of eight memory cell rows during every third refresh interval tREFIb corresponding to eight times the first refresh interval tREFI may be refreshed by bursts in the buffer memory 240 (S760).

When the measured temperature Tc is 45° C. or more and lower than 65° C. (S740), the refresh controller 234 may set the buffer memory 240 to be refreshed at the third refresh interval tREFIb corresponding to eight times the first refresh interval tREFI and/or may set memory cell rows of a second group formed of four memory cell rows during every third refresh interval tREFIb to be refreshed by bursts (S742). According to the refresh condition set in the refresh controller 234, the memory cell rows of the second group formed of four memory cell rows during every third refresh interval tREFIb corresponding to eight times the first refresh interval tREFI may be refreshed by bursts in the buffer memory 240 (S760).

When the measured temperature Tc is 25° C. or more and lower than 45° C. (S750), the refresh controller 234 may set the buffer memory 240 to be refreshed at the third refresh interval tREFIb corresponding to eight times the first refresh interval tREFI and/or may set memory cell rows of a third group formed of two memory cell rows during every third refresh interval tREFIb to be refreshed by bursts (S752). According to the refresh condition set in the refresh controller 234, the memory cell rows of the third group formed of two memory cell rows during every third refresh interval tREFIb corresponding to eight times the first refresh interval tREFI may be refreshed by bursts in the buffer memory 240 (S760).

When the measured temperature Tc is lower than 25° C. (S750), the refresh controller 234 may set the buffer memory 240 to be refreshed at a third refresh interval tREFIb corresponding to eight times the first refresh interval tREFI and/or may set one memory cell row during every third refresh interval tREFIb to be refreshed by bursts (S754). According to the refresh condition set in the refresh controller 234, one memory cell row during every third refresh interval tREFIb corresponding to eight times the first refresh interval tREFI may be burst refreshed in the buffer memory 240 (S760).

As illustrated in FIG. 8 with reference to the refresh method of the buffer memory 240 of FIG. 7, when the temperature Tc of the storage device 200 is 85° C. or more, the memory cell rows of the first group formed of eight memory cell rows during every second refresh interval tREFIa corresponding to twice the first refresh interval tREFI may be refreshed by bursts in the buffer memory 240. When the temperature Tc of the storage device 200 is 65° C. or more and lower than 85° C., the memory cell rows of the first group formed of eight memory cell rows during every third refresh interval tREFIb corresponding to eight times the first refresh interval tREFI may be refreshed by bursts.

When the temperature Tc of the storage device 200 is 45° C. or more and lower than 65° C., the memory cell rows of the second group formed of four memory cell rows during every third refresh interval tREFIb corresponding to eight times the first refresh interval tREFI may be refreshed by bursts. When the temperature Tc of the storage device 200 is 25° C. or more and lower than 45° C., the memory cell rows of the third group formed of two memory cell rows during every third refresh interval tREFIb corresponding to eight times the first refresh interval tREFI may be refreshed by bursts. When the temperature Tc of the storage device 200 is lower than 25° C., one memory cell row during every third refresh interval tREFIb corresponding to eight times the first refresh interval tREFI may be burst refreshed.

As illustrated in FIG. 9 based on refresh timing according to temperature of FIG. 8, a refresh operation of the buffer memory 240 may be performed during a refresh period tREF according to a pre-defined standard. In FIG. 9, the number of the refresh operations during the refresh period tREF may be reduced since refresh intervals increase as the temperature Tc decreases. It may be possible to reduce the number of precharge and active operations associated with the refresh operation, since the refresh operation may be performed by changing the number of refresh bursts during every refresh interval changed according to the temperature Tc. Therefore, it may be possible to reduce a burden on the performance of the storage device 200 (of FIG. 2) by performing the refresh operation of the buffer memory 240 so that the number of refresh bursts may be changed during every refresh interval corresponding to a measured temperature.

Figure 10:
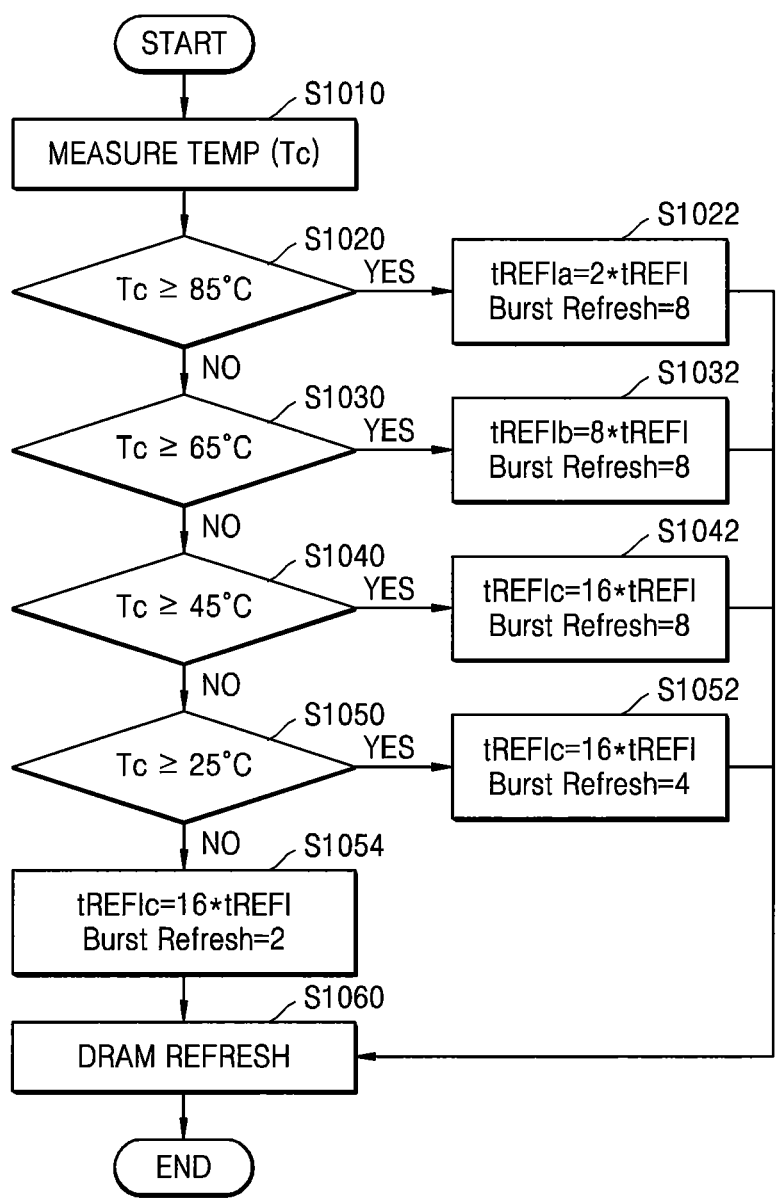
FIGS. 10 to 12 illustrate another embodiment of methods for managing data of a storage device responsive to temperature according to example embodiments of the inventive concepts.
Figure 11:
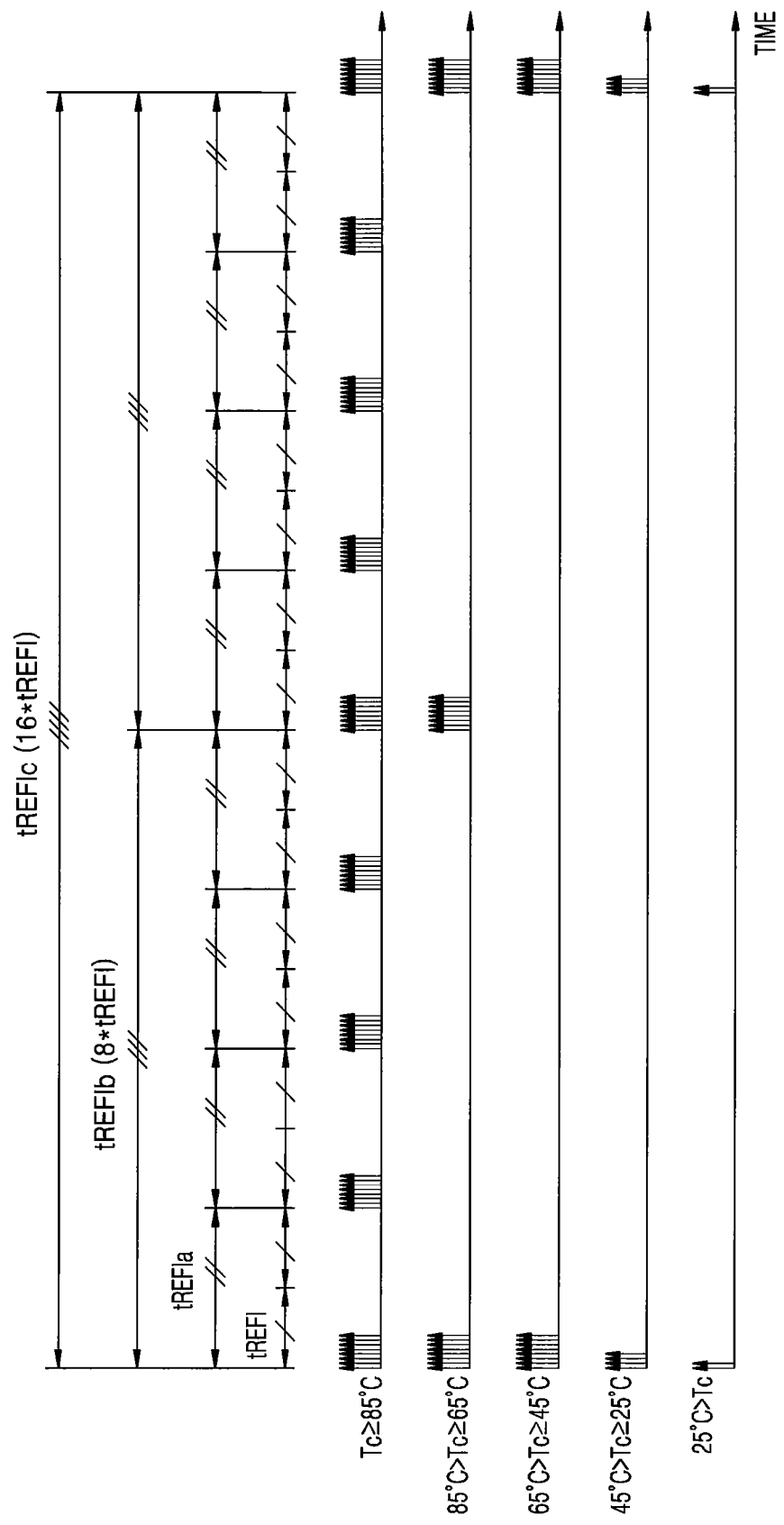
Figure 12:
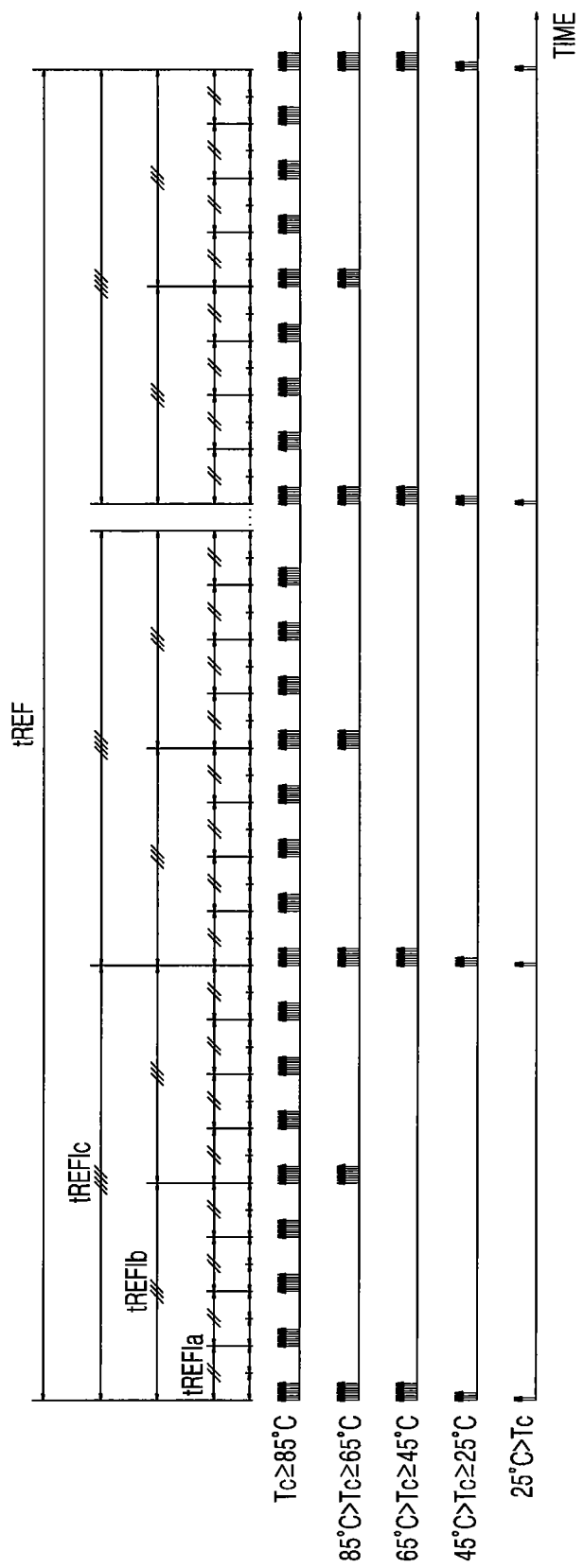

FIGS. 10 to 12 are views of a third example describing a method of managing data of a storage device responsive to temperature according to example embodiments of the inventive concepts. FIG. 10 is a flowchart illustrating a refresh method of a buffer memory 240 in the storage device 200, and FIGS. 11 and 12 are timing charts according to the refresh method of FIG. 10.

Referring to FIG. 10 in relation with the storage device 200 of FIG. 2, the temperature sensor 232 of the buffer memory controller 230 may measure temperature Tc of the storage device 200 (S1010).

When the measured temperature Tc is 85° C. or more (S1020), the refresh controller 234 may set the buffer memory 240 to be refreshed at a second refresh interval tREFIa corresponding to twice the first refresh interval tREFI and/or may set memory cell rows of a first group formed of eight memory cell rows during every second refresh interval tREFIa to be refreshed by bursts (S1022). According to a refresh condition set in the refresh controller 234, the memory cell rows of the first group formed of eight memory cell rows during every second refresh interval tREFIa corresponding to twice the first refresh interval tREFI may be refreshed by bursts in the buffer memory 240 (S1060).

When the measured temperature Tc is 65° C. or more and lower than 85° C. (S1030), the refresh controller 234 may set the buffer memory 240 to be refreshed at a third refresh interval tREFIb corresponding to eight times the first refresh interval tREFI and/or may set memory cell rows of the first group formed of eight memory cell rows during every third refresh interval tREFIb to be refreshed by bursts (S1032). According to the refresh condition set in the refresh controller 234, the memory cell rows of the first group formed of eight memory cell rows during every third refresh interval tREFIb corresponding to eight times the first refresh interval tREFI may be refreshed by bursts in the buffer memory 240 (S1060).

When the measured temperature Tc is 45° C. or more and lower than 65° C. (S1040), the refresh controller 234 may set the buffer memory 240 to be refreshed at a fourth refresh interval tREFIc corresponding to 16 times the first refresh interval tREFI and/or may set memory cell rows of the first group formed of eight memory cell rows during every fourth refresh interval tREFIc to be refreshed by bursts (S1042). According to the refresh condition set in the refresh controller 234, the memory cell rows of the first group formed of eight memory cell rows during every fourth refresh interval tREFIc corresponding to 16 times the first refresh interval tREFI may be refreshed by bursts in the buffer memory 240 (S1060).

When the measured temperature Tc is 25° C. or more and lower than 45° C. (S1050), the refresh controller 234 may set the buffer memory 240 to be refreshed at the fourth refresh interval tREFIc corresponding to 16 times the first refresh interval tREFI and/or may set memory cell rows of a second group formed of four memory cell rows during every fourth refresh interval tREFIc to be refreshed by bursts (S1052). According to the refresh condition set in the refresh controller 234, the memory cell rows of the second group formed of four memory cell rows during every fourth refresh interval tREFIc corresponding to 16 times the first refresh interval tREFI may be refreshed by bursts in the buffer memory 240 (S1060).

When the measured temperature Tc is lower than 25° C. (S1050), the refresh controller 234 may set the buffer memory 240 to be refreshed at the fourth refresh interval tREFIc corresponding to 16 times the first refresh interval tREFI and/or may set memory cell rows of a third group formed of two memory cell rows during every fourth refresh interval tREFIc to be refreshed by bursts (S1054). According to the refresh condition set in the refresh controller 234, memory cell rows of the third group formed of two memory cell rows during every fourth refresh interval tREFIc corresponding to 16 times the first refresh interval tREFI may be burst refreshed in the buffer memory 240 (S1060).

As illustrated in FIG. 11 with reference to the refresh method of the buffer memory 240 of FIG. 10, when the temperature Tc of the storage device 200 is 85° C. or more, the memory cell rows of the first group formed of eight memory cell rows during every second refresh interval tREFIa corresponding to twice the first refresh interval tREFI may be refreshed by bursts in the buffer memory 240. When the temperature Tc of the storage device 200 is 65° C. or more and lower than 85° C., the memory cell rows of the first group formed of eight memory cell rows during every third refresh interval tREFIb corresponding to eight times the first refresh interval tREFI may be refreshed by bursts.

When the temperature Tc of the storage device 200 is 45° C. or more and lower than 65° C., the memory cell rows of the first group formed of eight memory cell rows during every fourth refresh interval tREFIc corresponding to 16 times the first refresh interval tREFI may be refreshed by bursts. When the temperature Tc of the storage device 200 is 25° C. or more and lower than 45° C., the memory cell rows of the second group formed of four memory cell rows during every fourth refresh interval tREFIc corresponding to 16 times the first refresh interval tREFI may be refreshed by bursts. When the temperature Tc of the storage device 200 is lower than 25° C., memory cell rows of the third group formed of two memory cell rows during every fourth refresh interval tREFIc corresponding to 16 times the first refresh interval tREFI may be refreshed by bursts.

As illustrated in FIG. 12 based on refresh timing according to temperature of FIG. 11, a refresh operation of the buffer memory 240 may be performed during a refresh period tREF according to a pre-defined standard. In FIG. 12, the number of the refresh operations during the refresh period tREF may be reduced since refresh intervals increase as the temperature Tc decreases. It may be possible to reduce the number of precharge and active operations associated with the refresh operation, since the refresh operation is performed by changing the number of refresh bursts during every refresh interval changed according to the temperature Tc. Therefore, it may be possible to reduce a burden on the performance of the storage device 200 (of FIG. 2) by performing the refresh operation of the buffer memory 240 so that the number of refresh bursts may be changed during every refresh interval changed corresponding to a measured temperature.

Figure 13:
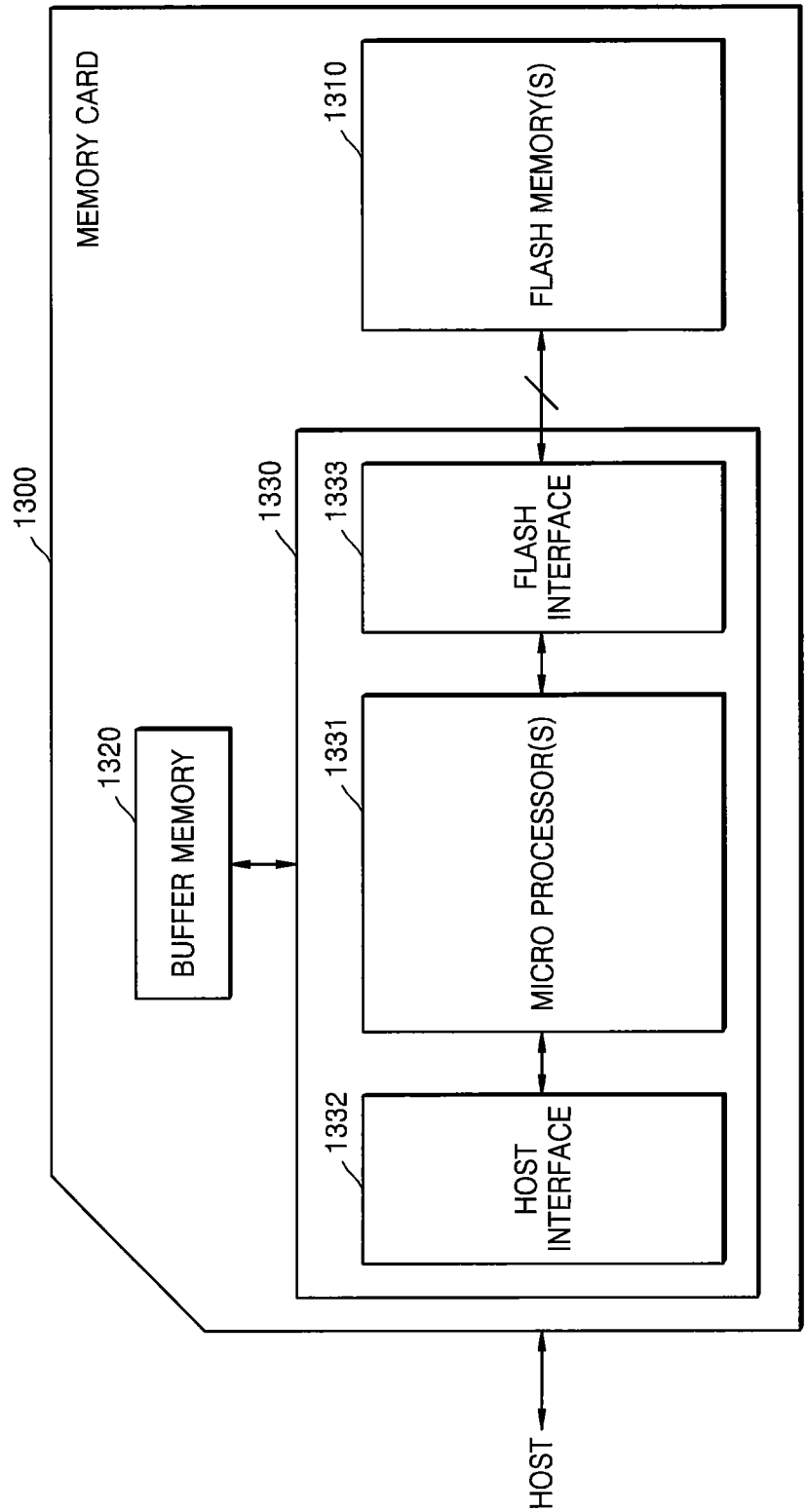
FIG. 13 is a view of a memory card according to example embodiments of the inventive concepts.

FIG. 13 is a view of a memory card according to example embodiments of the inventive concepts.

Referring to FIG. 13, a memory card 1300 may include at least one flash memory device 1310, a buffer memory device 1320, and a memory controller 1330 controlling the flash memory device 1310 and the buffer memory device 1320. As described with reference to FIGS. 4 to 12, the memory card 1300 may change refresh intervals responsive to temperature and may control a refresh operation of the buffer memory device 1320 so that the number of refresh bursts may be changed during every changed refresh interval.

The buffer memory device 1320 may be a device for temporarily storing data generated during an operation of the memory card 1300. The buffer memory device 1320 may be realized as DRAM. The controller 1330 may be connected to the flash memory device 1310 through a plurality of channels. The controller 1330 may be connected between a host and the flash memory device 1310. The controller 1330 may access the flash memory device 1310 in response to a request from the host.

The controller 1330 may include at least one microprocessor 1331, a host interface 1332, and a flash interface 1333. The at least one microprocessor 1331 may operate firmware. The host interface 1332 may interface with the host through card protocol, for example, a Secure Digital (SD)/multi-media card (MMC), for performing data exchange between the host and the memory card 1300. The memory card 1300 may be applied to, for example, an MMC, an SD, a miniSD, a memory stick, SmartMedia, a TransFlash card, though the inventive concepts are not limited thereto.

Figure 14:
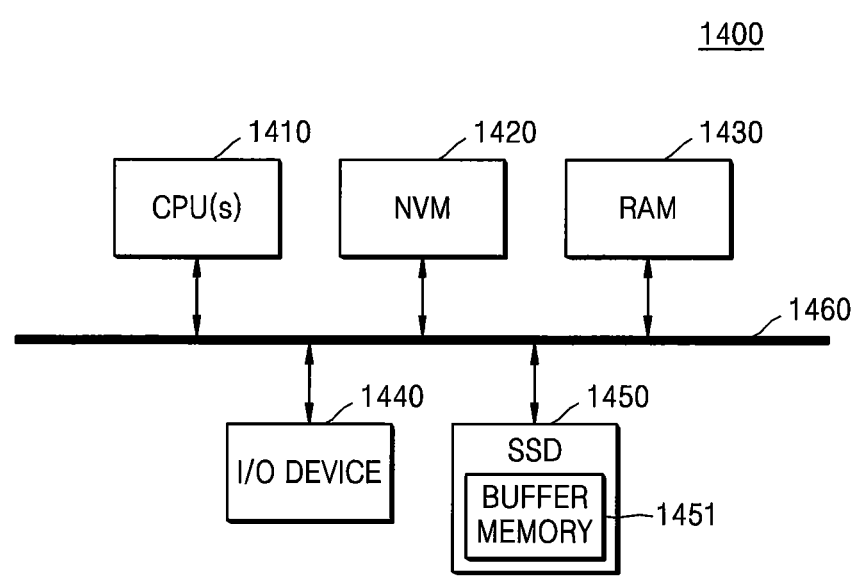
FIG. 14 is a view of a computing system having a solid-state drive (SSD) according to example embodiments of the inventive concepts.

FIG. 14 is a view of a computing system having an SSD according to example embodiments of the inventive concepts.

Referring to FIG. 14, a computing system 1400 may include at least one CPU 1410, at least one non-volatile memory device 1420, random access memory (RAM) 1430, at least one input/output device 1440, and/or at least one SSD 1450.

The at least one CPU 1410 may be connected to a system bus 1460. Data for operating the computing system 1400 may be stored in the at least one non-volatile memory device 1420. The data may be a start instruction sequence or a basic input/output operating system (BIOS) sequence. Data generated while the CPU 1410 is executed may be temporarily stored in the RAM 1430. The input/output device 1440 may be connected to the system bus 1460 through an input/output device interface such as a keyboard, a pointing device (mouse), a monitor, or a modem.

The SSD 1450, which may include a buffer memory 1451, may change refresh intervals responsive to temperature and may control a refresh operation of the buffer memory 1451 so that the number of refresh bursts may be changed during changed refresh intervals.

Figure 15:
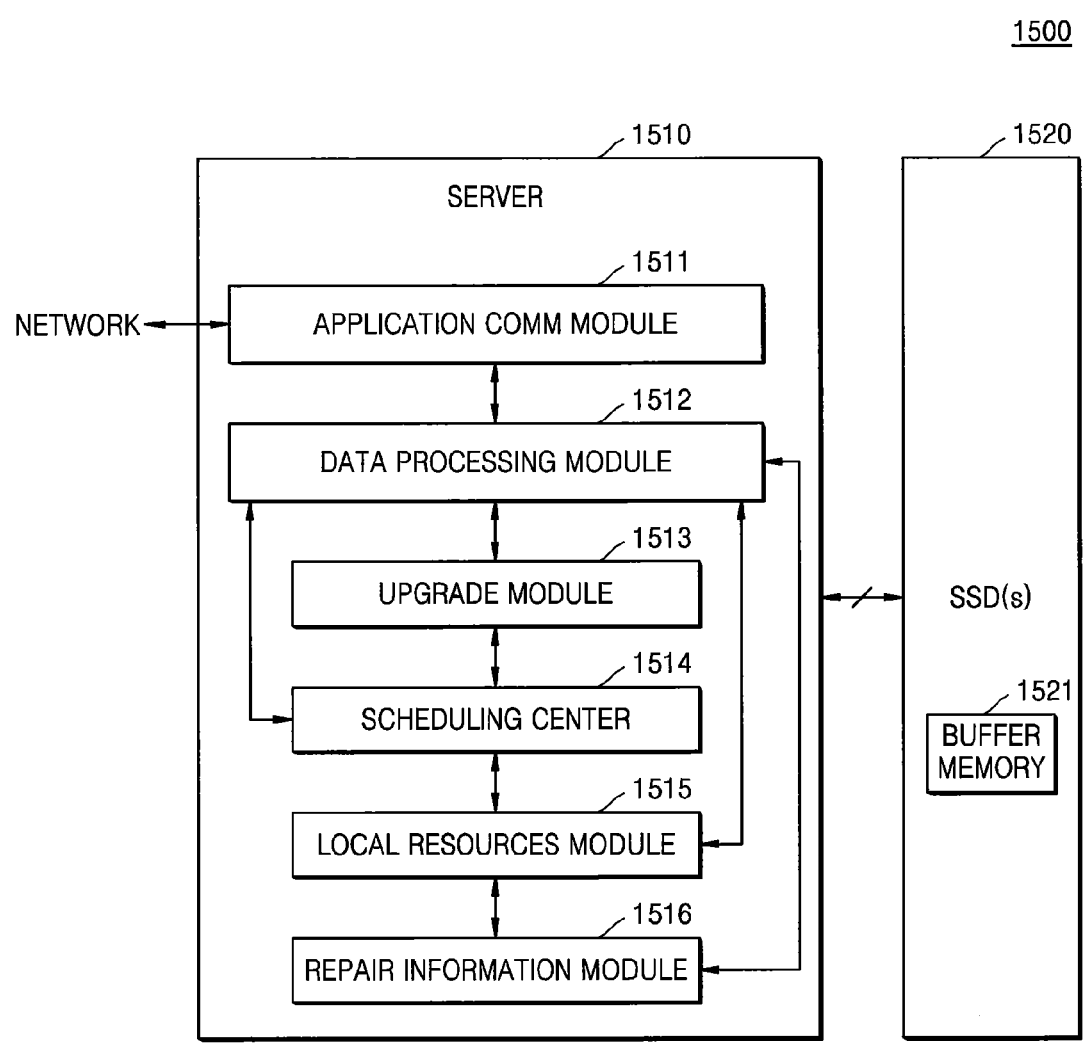
FIG. 15 is a view of a server system having an SSD according to example embodiments of the inventive concepts.

FIG. 15 is a view of a server system having an SSD according to example embodiments of the inventive concepts.

Referring to FIG. 15, a server system 1500 may include a server 1510 and at least one SSD 1520 storing data for operating the server 1510. The server 1510 may include an application communication module 1511, a data processing module 1512, an upgrade module 1513, a scheduling center 1514, a local resource module 1515, and a repair information module 1516. The application communication module 1511 may be configured so that the server 1510 may communicate with a computing system connected to a network or communicate with the SSD 1520. The application communication module 1511 may transmit data or information provided through a user interface to the data processing module 1512.

The data processing module 1512 may be linked to the local resource module 1515. The local resource module 1515 may provide the server system 1500 with a list of repair shops/dealers/technical information based on data or information connected to the server system 1500. The upgrade module 1513 may interface with the data processing module 1512. The upgrade module 1513 may upgrade an electronic appliance with firmware, a reset code, a diagnosis system, or other information based on data or information transmitted from the SSD 1520.

The scheduling center 1514 may permit a user to choose an option in real time based on the data or information input to the server 1510. The repair information module 1516 may interface with the data processing module 1512. The repair information module 1516 may be used to provide repair information, for example, audio, video, or a document file to a user. The data processing module 1512 may package information related to the information transmitted from the SSD 1520. Afterwards, the information may be transmitted to the SSD 1520 or displayed to a user.

The SSD 1520 may include a buffer memory 1521 in order to increase data transmission speed between the server 1510 and the SSD 1520. When the buffer memory 1521 is realized as a volatile memory such as DRAM, a refresh operation may be performed so that refresh intervals are changed responsive to temperature and the number of refresh bursts may be changed during changed refresh intervals in the buffer memory 1521.

While the inventive concepts have been particularly shown and described with reference to example embodiments thereof, it will be understood that various changes in form and details may be made therein without departing from the spirit and scope of the following claims.

What is claimed is:

1. A method of managing data of a storage device comprising a buffer memory, the method comprising:
    measuring a temperature of the storage device;
    changing a duration of a refresh interval of the buffer memory responsive to the measured temperature;
    changing a number of refresh bursts during the refresh interval responsive to the measured temperature; and
    refreshing data of the buffer memory based on the refresh interval and the number of the refresh bursts that are changed responsive to temperature.

2. The method of claim 1, wherein the buffer memory comprises dynamic random access memory (DRAM) comprising a plurality of memory cell rows wherein the buffer memory is configured to refresh a group of the plurality of memory cell rows corresponding to the number of the refresh bursts during the refresh interval.

3. The method of claim 2, the method of managing data comprising:
    refreshing a first group of the plurality of memory cell rows corresponding to a first number of refresh bursts during a first refresh interval at a first temperature; and
    refreshing the first group of the plurality of memory cell rows corresponding to the first number of refresh bursts during a second refresh interval that is longer than the first refresh interval at a second temperature that is lower than the first temperature.

4. The method of claim 2, the method of managing data comprising:
    refreshing a first group of the plurality of memory cell rows corresponding to a first number of refresh bursts during a first refresh interval at a first temperature; and
    refreshing a second group of the plurality of memory cell rows corresponding to a second number of refresh bursts smaller than the first number of refresh bursts during a second refresh interval that is longer than the first refresh interval at a second temperature that is lower than the first temperature.

5. The method of claim 1, wherein
    the storage device further comprises a data storage unit comprising a plurality of non-volatile memory cells, and
    the storage device further comprises storing data of the buffer memory in the data storage unit in response to a request from a host.

6. The method of claim 5, wherein the storage device further comprises transmitting the data of the buffer memory to the host in response to the request from the host.

7. The method of claim 1, wherein the storage device measures the temperature by using a temperature sensor.

8. A storage device comprising:
a data storage unit; and
a controller configured to control the data storage unit, wherein
the controller comprises:
a buffer memory configured to temporarily store data transmitted to and/or from the data storage unit; and
a buffer memory controller configured to change a duration of a refresh interval and a number of refresh bursts during the refresh interval responsive to a temperature.

9. The storage device of claim 8, wherein the buffer memory controller further comprises a temperature sensor configured to measure the temperature.

10. The storage device of claim 8, wherein the buffer memory comprises DRAM comprising a plurality of memory cell rows, and wherein the buffer memory is configured to refresh a group of the plurality of memory cell rows corresponding to the number of the refresh bursts during the refresh interval.

11. The storage device of claim 10, wherein the buffer memory refreshes a first group of the plurality of memory cell rows corresponding to a first number of refresh bursts during a first refresh interval at a first temperature, and refreshes the first group of the plurality of memory cell rows corresponding to the first number of refresh bursts during a second refresh interval that is longer than the first refresh interval at a second temperature that is lower than the first temperature.

12. The storage device of claim 10, wherein the buffer memory refreshes a first group of the plurality of memory cell rows corresponding to a first number of refresh bursts during a first refresh interval at a first temperature, and refreshes a second group of the plurality of memory cell rows corresponding to a second number of refresh bursts smaller than the first number of refresh bursts during a second refresh interval that is longer than the first refresh interval at a second temperature that is lower than the first temperature.

13. The storage device of claim 8, wherein the data storage unit comprises a non-volatile memory device comprising a plurality of non-volatile memory cells.

14. The storage device of claim 8, wherein the data stored in the buffer memory is stored in the data storage unit in response to a request from a host.

15. The storage device of claim 14, wherein the data stored in the buffer memory is transmitted to the host in response to a request from the host.

* * * * *